US008989684B1

United States Patent
Teo et al.

(10) Patent No.: US 8,989,684 B1
(45) Date of Patent: Mar. 24, 2015

(54) VOLTAGE REGULATOR FOR PROVIDING A REGULATED VOLTAGE TO SUBCIRCUITS OF AN RF FREQUENCY CIRCUIT

(71) Applicant: Marvell International Ltd., Hamilton (BM)

(72) Inventors: Swee-Ann Teo, Sunnyvale, CA (US); Lawrence Tse, Fremont, CA (US); Yonghua Song, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/163,365

(22) Filed: Jan. 24, 2014

Related U.S. Application Data

(63) Continuation of application No. 13/709,627, filed on Dec. 10, 2012, now Pat. No. 8,639,201, which is a continuation of application No. 12/893,604, filed on Sep. 29, 2010, now Pat. No. 8,331,884, which is a (Continued)

(51) Int. Cl.
H04N 1/04 (2006.01)
H04B 1/40 (2006.01)

(52) U.S. Cl.
CPC .................................. H04B 1/40 (2013.01)
USPC .................................. 455/127.1; 455/241.1

(58) Field of Classification Search
USPC ............. 455/127.1, 127.2, 241.1, 126, 253.2; 323/280
See application file for complete search history.

(56) References Cited

U.S. PATENT DOCUMENTS

| 4,359,679 | A | 11/1982 | Regan |
| 4,439,819 | A | 3/1984 | Regan |
| 4,766,364 | A | 8/1988 | Biamonte et al. |
| 5,175,488 | A | 12/1992 | Moroney |
| 5,901,070 | A | 5/1999 | Trainor |
| 6,130,526 | A | 10/2000 | Yang et al. |
| 6,246,221 | B1 | 6/2001 | Xi |

(Continued)

FOREIGN PATENT DOCUMENTS

EP 0942531 9/1999

OTHER PUBLICATIONS

ANSI/IEEE Std. 802.11, 1999 Edition; Part 11: Wireless LAN Medium Access Cntrol (MAC) and Physical Layer (PHY) Specifications; Information technology—Telecommunications and information exchange between systems—Local and metropolitan area networks—Specific requirements; pp. 1-512.

(Continued)

Primary Examiner — Sonny Trinh

(57) ABSTRACT

A voltage regulator for a plurality of radio frequency subcircuits of a radio frequency circuit. A first transistor configured to receive, based on a comparison between a reference voltage signal and a feedback signal, a bias signal corresponding to a desired regulated voltage for the plurality of radio frequency subcircuits, output the bias signal, and generate the feedback signal according to the bias signal as output from the first transistor. A second transistor configured to receive the bias signal as output from the first transistor and provide, based on the bias signal, the desired regulated voltage to a respective first one of the plurality of radio frequency subcircuits. A third transistor is configured to receive the bias signal as output from the first transistor and provide, based on the bias signal, the desired regulated voltage to a respective second one of the plurality of radio frequency subcircuits.

19 Claims, 4 Drawing Sheets

Related U.S. Application Data continuation of application No. 11/715,027, filed on Mar. 7, 2007, now Pat. No. 7,809,339, which is a continuation of application No. 10/747,522, filed on Dec. 29, 2003, now Pat. No. 7,190,936.

(60) Provisional application No. 60/470,620, filed on May 15, 2003.

(56) References Cited

U.S. PATENT DOCUMENTS

| | | | |
|---|---|---|---|
| 6,529,563 B1 | 3/2003 | Mosinskis et al. | |
| 6,765,374 B1 | 7/2004 | Yang et al. | |
| 6,806,690 B2 | 10/2004 | Xi | |
| 6,861,827 B1 | 3/2005 | Yang et al. | |
| 7,030,595 B2 | 4/2006 | Akita | |
| 7,058,374 B2 | 6/2006 | Levesque et al. | |
| 7,106,034 B2 | 9/2006 | Chien et al. | |
| 7,174,534 B2 | 2/2007 | Chong et al. | |
| 7,190,936 B1 | 3/2007 | Teo et al. | |
| 7,207,054 B1 | 4/2007 | Richards et al. | |
| 7,274,176 B2 | 9/2007 | Mihara | |
| 7,312,652 B2 * | 12/2007 | Brox | 327/541 |
| 7,421,256 B2 | 9/2008 | Levesque et al. | |
| 7,514,909 B2 | 4/2009 | Burstein et al. | |
| 7,522,436 B2 | 4/2009 | Schultz et al. | |
| 7,616,463 B2 | 11/2009 | Bustein | |
| 7,675,273 B2 * | 3/2010 | Ko et al. | 323/269 |
| 7,723,968 B2 | 5/2010 | Okuyama et al. | |
| 7,809,339 B1 | 10/2010 | Teo et al. | |
| 7,994,791 B2 | 8/2011 | Hall et al. | |
| 2005/0057234 A1 | 3/2005 | Yang et al. | |
| 2005/0190475 A1 | 9/2005 | Poss | |
| 2005/0208909 A1 | 9/2005 | Maya et al. | |

OTHER PUBLICATIONS

IEEE P802.11g/D8.2 Apr. 2003 (Supplement to ANSI/IEEE std. 802.11 1999(Reaff 2003)) Draft Supplement Standard for Part 11: Wireless LAN Medium Access Cntrol (MAC) and Physical Layer (PHY) Specifications; Information technology—Telecommunications and information exchange between systems—Local and metropolitan area networks—Specific requirements; Further Higher Data Rate Extension in the 2.4 GHz Band; pp. 1-69.

IEEE Std. 802.11a-1999; Supplement to IEEE Standard for Information Technology—Telecommunications and information exchange between systems—Local and metropolitan area networks—Specific requirements; Part: 11 Wireless LAN Medium Access Control (MAC) and Physical Layer (PHY) specifications; High-speed Physical Layer in the 5 GHz Band; pp. 1-83.

IEEE Std. 802.11b; Supplement to IEEE Standard for Information technology—Telecommunications and information exchange between systems—Local and metropolitan area networks—Specific requirements; Part 11: Wireless LAN Medium Access Control (MAC) and Physical Layer (PHY) specifications: Higher-Speed Physical Layer Extension in the 2.4 GHz Band; Approved Sep. 16, 1999; pp. 1-89.

IEEE Std. 802.11b-1999/Cor Jan. 2001;IEEE Standard for Information technology—Telecommunications and information exchange between systems—Local and metropolitan area networks—Specific requirements; Part 11: Wireless LAN Medium Access Cntrol (MAC) and Physical Layer (PHY) Specifications; Amendment 2: Higher-speed Physical Layer (PHY) extension in the 2.4 GHz band—Corrigendum 1; pp. 1-15.

IEEE Std. 802.16; IEEE Standard for Local and metropolitan area networks; Part 16: Air Interface for Fixed Broadband Wireless Access Systems; Apr. 8, 2002; pp. 1-322.

IEEE Std. 802.16a; IEEE Standard for Local and metropolitan area networks; Part 16: Air Interface for Fixed Broadband Wireless Access Systems—Amendment 2: Medium Access Control Modifications and Additional Physical Layer Specifications for 2-11 GHz; Apr. 1, 2003; pp. 1-292.

IEEE Std. 802.16; IEEE Standard for Local and Metropolitan Area Networks; Part 16; Air Interface for Fixed Broadband Wireless Access Systems, 802.16 IEEE Standard for Local and Metropolitan Area Networks, Oct. 1, 2004, pp. i-xxxiv and pp. 1-857, IEEE Std. 802.16-2004, IEEE, United States.

* cited by examiner

VOLTAGE REGULATOR FOR PROVIDING A REGULATED VOLTAGE TO SUBCIRCUITS OF AN RF FREQUENCY CIRCUIT

CROSS-REFERENCE TO RELATED APPLICATIONS

The present disclosure is a continuation of U.S. patent application Ser. No. 13/709,627 (non U.S. Pat. No. 8,639,201), filed on Dec. 10, 2012, which is a continuation of U.S. patent application Ser. No. 12/893,604 (now U.S. Pat. No. 8,331,884), filed on Sep. 29, 2010, which is a continuation of U.S. patent application Ser. No. 11/715,027 (now U.S. Pat. No. 7,809,339), filed on Mar. 7, 2007, which is a continuation of U.S. patent application Ser. No. 10/747,522 (now U.S. Pat. No. 7,190,936), filed Dec. 29, 2003, which claims the benefit of U.S. Provisional Application No. 60/470,620, filed on May 15, 2003. The entire disclosures of the applications referenced above are incorporated herein by reference.

FIELD

The present invention relates to voltage regulators, and more particularly to voltage regulators for high performance radio frequency (RF) systems.

BACKGROUND

Circuits in high performance radio frequency (RF) systems such as but not limited to wireless communications devices often require a regulated supply voltage. Voltage regulators are typically used to regulate the supply voltage. In some RF systems, more than one voltage regulator may be required. In other applications with spatial limitations, multiple circuits may share the same voltage regulator. For example, a voltage-controlled oscillator (VCO) circuit and a mixer circuit may share the same regulated supply. In this configuration, noise from the mixer circuit often appears at the output of the VCO circuit and vice-versa.

Referring now to FIG. 1, an exemplary voltage regulator 10 includes an operational amplifier (opamp) 12 and a PMOS transistor 14. An inverting input of the opamp 12 receives a reference voltage signal 16 and a non-inverting input of the opamp 12 receives a feedback signal 18. The opamp 12 generates an output voltage signal 20 that is based on a difference between the reference voltage signal 16 and the feedback signal 18.

The output voltage signal 20 is input to a gate of the PMOS transistor 14. A source of the PMOS transistor 14 is connected to a supply voltage 22. A drain of the PMOS transistor 14 is connected to the non-inverting input of the opamp 12 to provide the feedback signal 18. The voltage regulator 10 outputs a regulated signal 26 to an RF subcircuit 28 of a RF system 30. When supplying a single RF subcircuit 28, the regulated signal 26 is stable and constant. When a single voltage regulator supplies more than one RF subcircuit, noise or crosstalk from one of the RF sub-circuits may appear in the output of the other RF sub-circuit.

Referring now to FIG. 2, separate voltage regulators may be used for each subcircuit to eliminate the noise. The RF circuit 30 includes n RF subcircuits 28-1, . . . , 28-n that require voltage regulation. Voltage regulators 10-1, . . . , 10-n are provided for each RF subcircuit 28-1, . . . , 28-n, respectively. The voltage regulators 10-1, . . . , 10-n include opamps 12-1, . . . , 12-n, and transistors 14-1, . . . , 14n, respectively. Feedback signals 18-1, . . . , 18-n are generated as described above. When multiple voltage regulators 10-1, . . . , 10n are used, the spatial requirements and current dissipation of the RF system 30 increase.

SUMMARY

A voltage regulator according to the present invention includes a master regulator circuit that receives a reference signal, that generates a master bias signal and that includes a transistor having a first gain. A first slave regulator circuit includes a first transistor having a second gain that is substantially equal to unity gain, a control terminal that receives the master bias signal from the master regulator circuit, a first terminal and a second terminal that outputs a first regulated output signal. A second slave regulator circuit includes a second transistor having a third gain that is substantially equal to unity gain, a control terminal that receives the master bias signal from the master regulator circuit, a first terminal, and a second terminal that outputs a second regulated output signal.

In other features, the master regulator circuit includes an opamp having a non-inverting input that receives the reference signal, an inverting input and an output. The output of the opamp generates the master bias signal, which is output to a control terminal of the transistor.

In yet other features, the master regulator circuit includes a current source. A second terminal of the transistor communicates with the current source and the inverting input of the opamp. The transistor includes a first terminal. The first terminals of the transistor, the first transistor and the second transistor are biased by a first voltage potential.

In still other features, the transistor, the first transistor and the second transistor are NMOS transistors. The first gain is greater than unity gain.

In still other features, a Radio Frequency (RF) circuit includes the voltage regulator, a first RF subcircuit that receives the first regulated output signal, and a second RF subcircuit that receives the second regulated output signal. The RF circuit is a wireless communications device.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF DRAWINGS

The present invention will become more fully understood from the detailed description and the accompanying drawings, wherein.

DESCRIPTION

Figure 2:
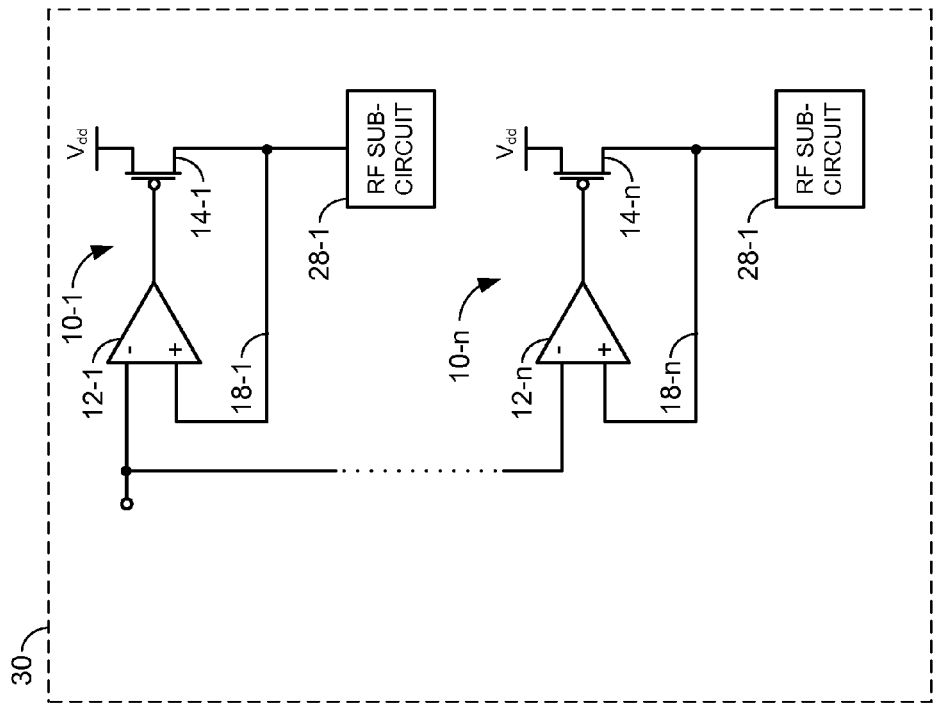
FIG. 2 is a schematic of an RF circuit with multiple RF subcircuits and voltage regulators with feedback circuits according to the prior art.

The following description of the preferred embodiment(s) is merely exemplary in nature and is in no way intended to limit the invention, its application, or uses. For purposes of clarity, the same reference numbers will be used in the drawings to identify similar elements.

Figure 3:
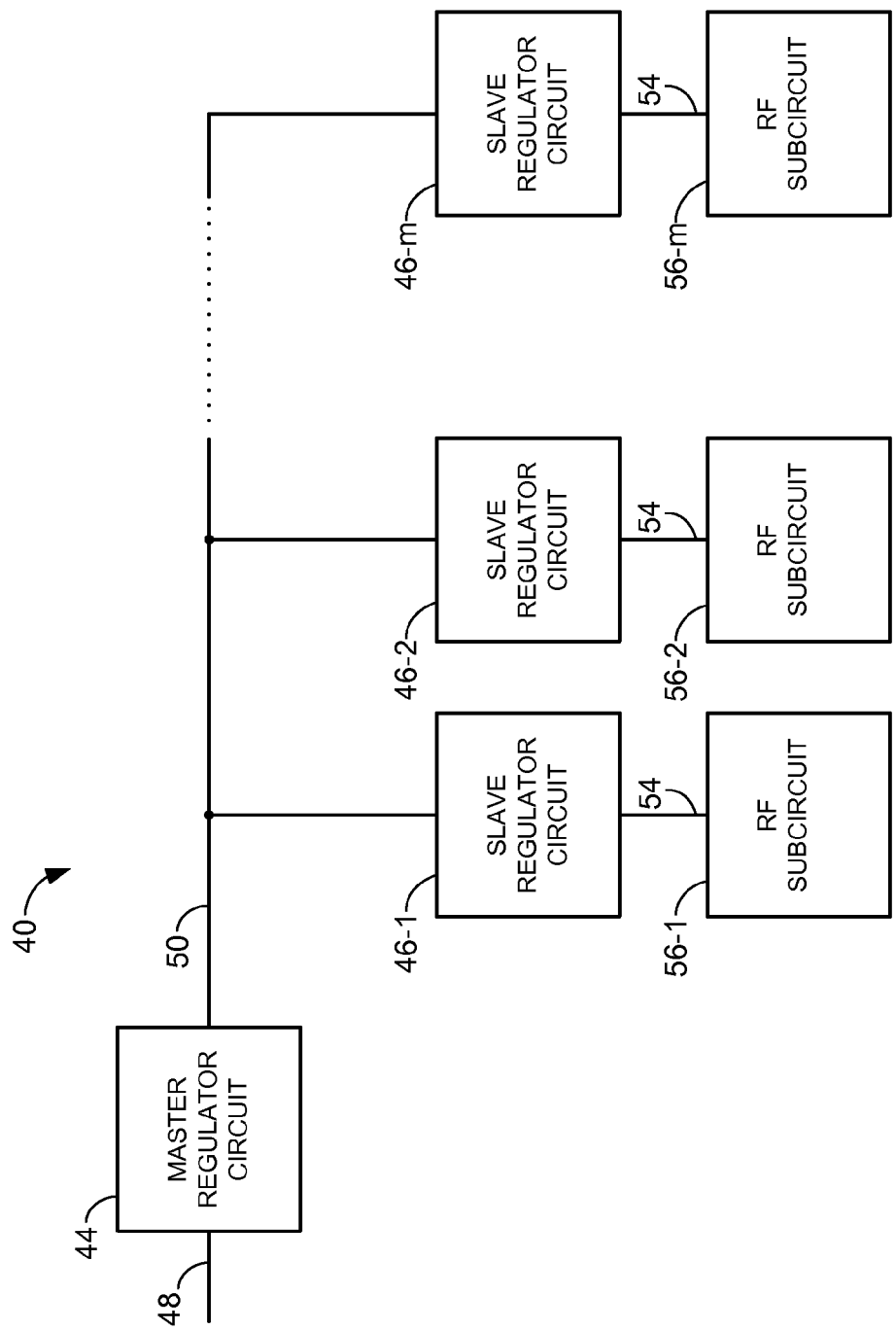
FIG. 3 is a functional block diagram of a voltage regulator with a master and multiple slave regulator circuits according to the present invention.

Referring now to FIG. 3, a voltage regulator 40 includes a master regulator circuit 44 and one or more slave regulator circuits 46-1, 46-2, ..., and 46-m (collectively identified as slave regulator circuits 46). The master regulator circuit 44 receives a reference voltage signal 48 and generates a master bias signal 50, as will be described below. The slave regulator circuits 46 receive the master bias signal 50 from the master regulator circuit 44. The slave regulator circuits 46 output a regulated signal 54 based on the master bias signal 50. RF subcircuits 56-1, 56-2, ..., and 56-m (collectively identified as RF subcircuits 56) receive the regulated signal 54. Because the desired supply voltage for the RF subcircuit 56 is sensed and adjusted at the master regulator circuit 44, the slave regulator circuits 46 operate as level shifters and unity gain buffers and have feedback. The slave regulator circuits 46 have a second gain that is substantially equal to unity gain. As used herein, the term substantially equally to unity gain means a gain that is greater than 0.5 and less than 2.

Figure 4:
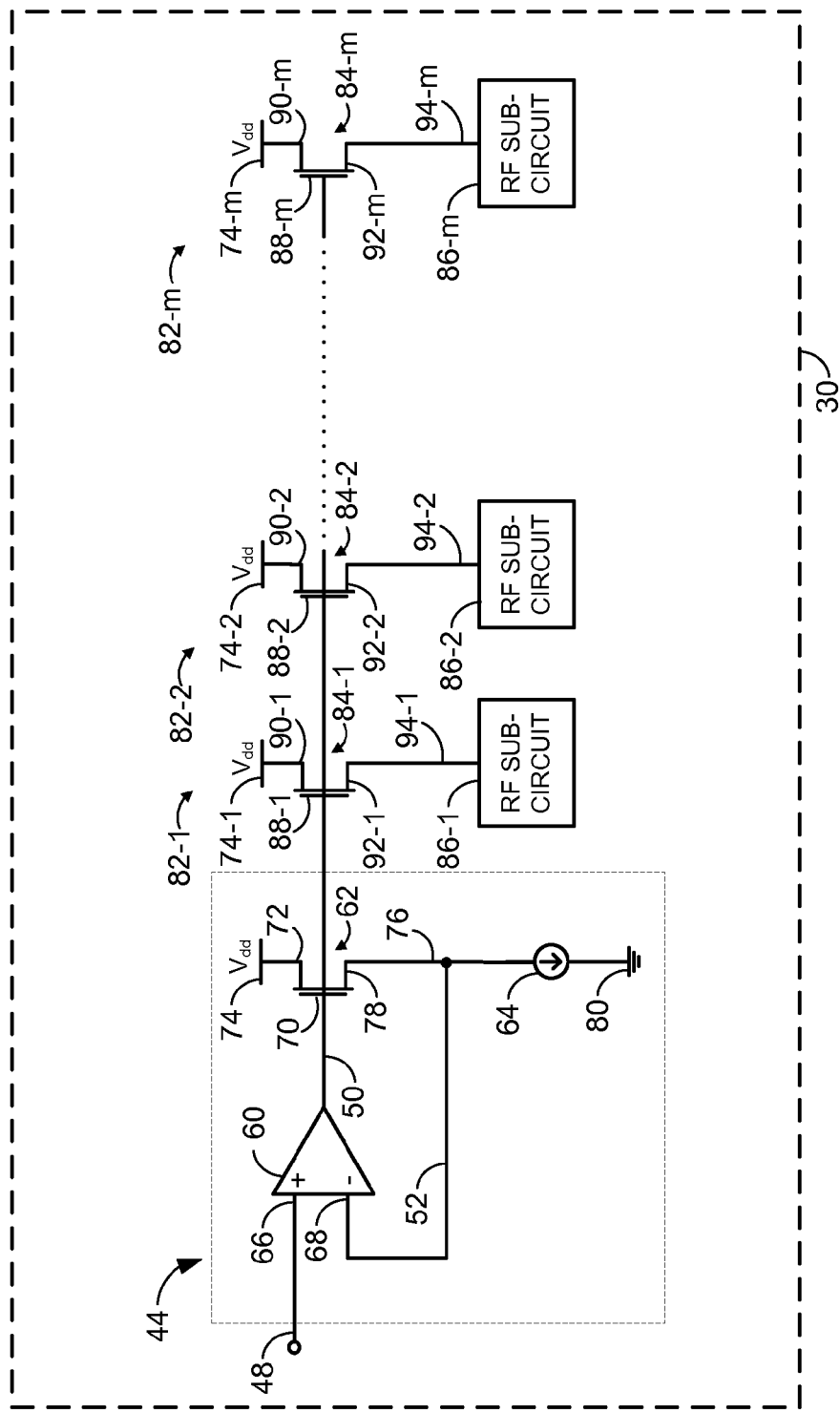
FIG. 4 is an electric schematic of the voltage regulator of FIG. 3.

Referring now to FIG. 4, the master regulator circuit 44 includes an opamp 60, a first NMOS transistor 62, and a current source 64. The reference voltage signal 48 communicates with a non-inverting input 66 of the opamp 60. The opamp 60 outputs the master bias signal 50, which biases a gate terminal 70 of the first NMOS transistor 62. A drain terminal 72 of the first NMOS transistor 62 communicates with a supply voltage 74. A source terminal 78 of the first NMOS transistor 62 communicates with an inverting input 68 of the opamp 60 to provide a feedback signal 52 and with the current source 64, which is referenced to a ground potential 80.

The master bias signal 50 is regulated based on a difference between the reference voltage signal 48 and the feedback signal 52. The master bias signal 50 is output to slave regulator circuits 82-1, 82-2, ..., 82-m. The slave regulator circuits 82-1, 82-2, ..., 82-m include second NMOS transistors 84-1, 84-2, ..., 84-m. The slave regulator circuits 82-1, 82-2, ..., 82-m provide a regulated signal to RF subcircuits 86-1, 86-2, ..., 86-m of the RF system 30. The master bias signal 50 biases gates 88-1, 88-2, ..., 88-m of the second NMOS transistors 84-1, 84-2, ..., 84-m. Drain terminals 90-1, 90-2, ..., 90-N of the second NMOS transistors 84-1, 84-2, ..., 84-m communicate with a supply voltage 74-1, 74-2, ..., 74-m. Source terminals 92-1, 92-2, ..., 92-m of the second NMOS transistors 84-1, 84-2, ..., 84-m output a regulated supply voltage signal 94-1, 94-2, ..., 94-m to the RF subcircuits 86-1, 86-2, ..., 86-m. In this arrangement, the second NMOS transistors 84-1, 84-2, ..., 84-m act as source followers.

Figure 1:
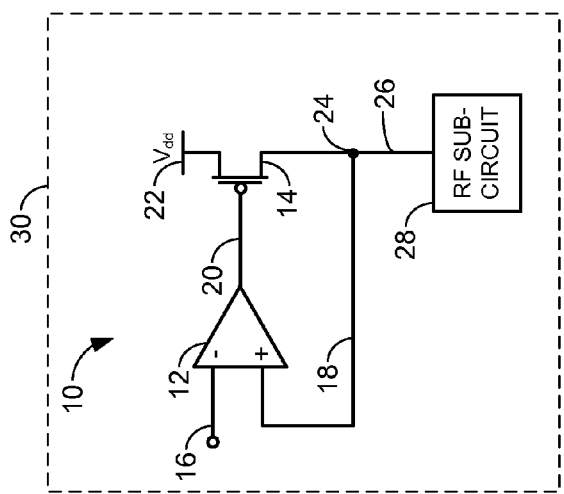
FIG. 1 is a schematic of an exemplary voltage regulator according to the prior art.

The regulated supply voltage 94-1, 94-2, ..., 94-m is based on a difference between the reference voltage signal 48 and the feedback signal 52, which is generated in the master regulator circuit 44. Because the second NMOS transistors 84-1, 84-2, ..., 84-m have substantially unity gain, the slave regulator circuits 82-1, 82-2, ..., 82-m act as unity gain buffers for the master control voltage signal 50. In conventional regulator circuits shown in FIGS. 1 and 2, a small change in the output signal 20 can significantly impact the regulated signal 26 that is input to the circuit blocks 28 because the PMOS transistor 14 does not have unity gain.

Figure 5:
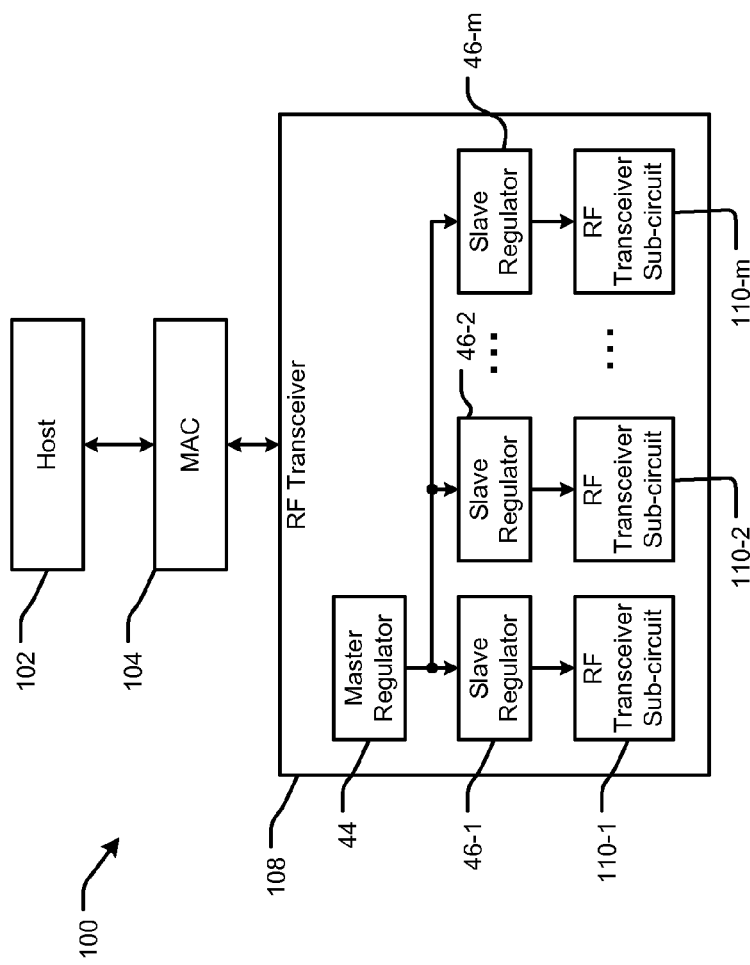
FIG. 5 is a functional block diagram of the voltage regulator of FIG. 3 implemented in an RF transceiver of a wireless communications device.

Referring now to FIG. 5, the master regulator 44 and slave regulators 46-1, 46-2, ..., 46-m can be used in wireless communication devices. In one implementation, a wireless communications device 100 is connected to a host device 102 such as but not limited to a desktop computer, a personal digital assistant (PDA), a laptop computer, a gaming console, an access point and the like. The wireless communications device 100 further includes a medium access control (MAC) device 104 and an RF transceiver 108. The master regulator 44 and slave regulators 46-1, 46-2, ..., and 46-m supply regulated outputs to RF subcircuits 110-1, 110-2, ..., and 110-m of the RF transceiver 108. In one implementation, the wireless communications device is compliant with at least one of IEEE 802.11, 802.11a, 802.11g, 802.11n, and/or 802.16, which are hereby incorporated by reference in their entirety, although other existing and future wireless standards may be used.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A voltage regulator for a plurality of radio frequency subcircuits of a radio frequency circuit, the voltage regulator comprising:
a first transistor configured to (i) receive, based on a comparison between a reference voltage signal and a feedback signal, a bias signal corresponding to a desired regulated voltage for the plurality of radio frequency subcircuits, (ii) output the bias signal, and (iii) output the feedback signal according to the bias signal from the first transistor;
a second transistor configured to (i) receive the bias signal from the first transistor and (ii) provide, based on the bias signal, the desired regulated voltage to a respective first radio frequency subcircuit of the plurality of radio frequency subcircuits; and
a third transistor configured to (i) receive the bias signal as output from the first transistor and (ii) provide, based on the bias signal, the desired regulated voltage to a respective second radio frequency subcircuit of the plurality of radio frequency subcircuits.

2. The voltage regulator of claim 1, wherein each of the plurality of radio frequency subcircuits is configured to perform an operation of the radio frequency circuit in accordance with the desired regulated voltage.

3. The voltage regulator of claim 1, further comprising an operational amplifier configured to (i) compare the reference voltage signal with the feedback signal, (ii) generate the bias signal based on the comparison between the reference voltage signal and the feedback signal, and (iii) provide the bias signal to a gate of the first transistor.

4. The voltage regulator of claim 1, wherein the bias signal as received by the first transistor is based on a difference between the reference voltage signal and the feedback signal.

5. The voltage regulator of claim 1, wherein the first transistor is connected between a supply voltage and a current source.

6. The voltage regulator of claim 1, wherein each of the second transistor and the third transistor have a gain that is substantially equal to a unity gain.

7. The voltage regulator of claim 1, wherein each of the second transistor and the third transistor is configured to operate as a source follower.

8. The voltage regulator of claim 1, wherein each of the second transistor and the third transistor is configured to operate as a level shifter.

9. The voltage regulator of claim 1, wherein each of the second transistor and the third transistor is connected to a supply voltage.

10. A wireless communication device including the voltage regulator of claim 1.

11. A method for operating a voltage regulator for a plurality of radio frequency subcircuits of a radio frequency circuit, the method comprising:
- at a first transistor
  - receiving, based on a comparison between a reference voltage signal and a feedback signal, a bias signal corresponding to a desired regulated voltage for the plurality of radio frequency subcircuits,
  - outputting the bias signal, and
  - outputting the feedback signal according to the bias signal from the first transistor;
- at a second transistor
  - receiving the bias signal as output from the first transistor, and
  - providing, based on the bias signal, the desired regulated voltage to a respective first radio frequency subcircuit of the plurality of radio frequency subcircuits; and
- at a third transistor
  - receiving the bias signal as output from the first transistor, and
  - providing, based on the bias signal, the desired regulated voltage to a respective second radio frequency subcircuit of the plurality of radio frequency subcircuits.

12. The method of claim 11, further comprising, using each of the plurality of radio frequency subcircuits, performing an operation of the radio frequency circuit in accordance with the desired regulated voltage.

13. The method of claim 11, further comprising:
- comparing the reference voltage signal with the feedback signal;
- generating the bias signal based on the comparison between the reference voltage signal and the feedback signal, and (iii) provide the bias signal to a gate of the first transistor.

14. The method of claim 11, wherein receiving the bias signal at the first transistor includes receiving the bias signal based on a difference between the reference voltage signal and the feedback signal.

15. The method of claim 11, wherein the first transistor is connected between a supply voltage and a current source.

16. The method of claim 11, wherein each of the second transistor and the third transistor have a gain that is substantially equal to a unity gain.

17. The method of claim 11, further comprising configuring each of the second transistor and the third transistor to operate as a source follower.

18. The method of claim 11, further comprising configuring each of the second transistor and the third transistor to operate as a level shifter.

19. The method of claim 11, further comprising receiving a supply voltage at each of the second transistor and the third transistor.

* * * * *